United States Patent [19]

Norris et al.

[11] Patent Number: 4,685,120
[45] Date of Patent: Aug. 4, 1987

[54] ELECTRONIC TRIGGER SWITCH FOR MAINTENANCE TERMINATION UNIT

[75] Inventors: Richard G. Norris, Arlington; Monty F. Webb, Richardson; Vinh Q. Le, Arlington, all of Tex.

[73] Assignee: Teccor Electronics, Inc., Irving, Tex.

[21] Appl. No.: 801,758

[22] Filed: Nov. 26, 1985

[51] Int. Cl.$^4$ .............................................. H04B 3/46
[52] U.S. Cl. ...................................... 379/26; 307/632
[58] Field of Search ................. 179/175.3 F, 175.3 R; 307/252 B

[56] References Cited

U.S. PATENT DOCUMENTS

| 4,169,220 | 9/1979 | Fields | 179/175.3 R |
| 4,373,121 | 2/1983 | Sartori et al. | 179/175.3 F |
| 4,396,809 | 8/1983 | Brunssen | 179/175.3 F |

OTHER PUBLICATIONS

General Electric Co., SCR Manual, p. 110 (6th ed., 1979).
Teccor Electronics, Inc., General Catalog: Semiconductor Devices, pp. 8–9, 95–103 (1982).
Bell System Technical Reference, Maintenance Termination Unit Specification, pp. 1–20 (A.T. & T., Apr. 1983).
Circuit diagram prepared by applicants, Feb., 1986.

Primary Examiner—Stafford D. Schreyer
Attorney, Agent, or Firm—Richards, Harris, Medlock & Andrews

[57] ABSTRACT

A telephone maintenance termination unit utilizes a low voltage, bidirectional trigger switch. The trigger switch provides low voltage, low current triggering in conjunction with a high holding current requirement. The trigger switch may comprise either two silicon controlled rectifiers connected in inverse parallel relationship with their gates connected, a bidirectional diffused PNPN semiconductor device, or an NPN semiconductor device, any one of which is used to trigger a power control TRIAC. In another embodiment, the switching device may be a two-terminal, unitary semiconductor device incorporating the functions of both the TRIAC and the bidirectional trigger switch.

7 Claims, 8 Drawing Figures

ELECTRONIC TRIGGER SWITCH FOR MAINTENANCE TERMINATION UNIT

TECHNICAL FIELD

This invention relates to electronic devices used to trigger thyristors, and in particular to electronic trigger switches used in telephone maintenance termination units.

BACKGROUND OF THE INVENTION

The thyristor family of semiconductor devices consists of several very useful devices, including silicon controlled rectifiers (SCRs), DIACS, and TRIACS. Thyristors are characterized by having two states, an on-state and an off-state, making them useful for electric power regulation, switching, and phase control.

An SCR is a unidirectional PNPN semiconductor device having an anode, a cathode, and a gate. In the off-state, an SCR is a high-resistance, low-current circuit element at voltages up to its breakover voltage. A momentary positive pulse applied to the gate of an SCR will bias the device so that it switches to the on-state and becomes a low-resistance, high-current element. Once an SCR is in the on-state, it will remain in the on-state until the principal anode to cathode current drops below the holding current of the device.

A TRIAC is a bidirectional thyristor which functions to control power in an AC electric circuit. The operation of a TRIAC can be related to two SCRs connected in inverse parallel. A TRIAC has a single gate, and the device can be triggered to the on-state by a gate pulse of either polarity. A TRIAC operates in a circuit in both directions essentially the same as an SCR behaves in its forward direction.

A DIAC is essentially an open base NPN transistor. A DIAC functions as a bidirectional circuit element which exhibits a high impedance state at voltages up to its voltage breakover point. Above the voltage breakover point a DIAC enters its on-state region, where current flows through the device as it exhibits decreasing resisitivity. Because of these characteristics, a DIAC can be used in a resistor-capacitor AC circuit to produce a bidirectional pulsing oscillator. In addition, a DIAC is an economical bidirectional device for triggering TRIACs in phase control circuits.

In many electrical applications it is desirable to have a power control circuit having a low voltage, low current triggering response with a relatively high holding current requirement. The high holding current can be provided by a TRIAC, but a standard DIAC does not provide the desired triggering characteristics for a TRIAC in such an application. This is because a standard DIAC has a higher voltage requirement and does not switch on completely at the breakover point. To achieve low voltage triggering capability for TRIACs, it has been necessary to construct relatively complicated triggering circuits comprising a plurality of transistors, resistors, and diodes in a bride network. Such circuits have been simplified only to a limited extent by placing two integrated circuits on a chip to produce a silicon bilateral switch (SBS) such as the General Electric type 2N4991.

Because of the complexity of the prior art TRIAC triggering circuits, it is desirable to provide a simplified, economical, bidirectional, low voltage trigger device which switches on fully when the trigger voltage is reached.

A specific application which requires a low voltage trigger switch for a TRIAC is the maintenance termination unit (MTU) of a telephone line. The MTU is a diagnostic circuit placed at the subscriber's terminal of a telephone line and used for analyzing faults and maintaining the line. An MTU provided by the Western Electric Company utilizes a complicated trigger circuit to provide the specific low voltage switching capability necessary for the desired MTU response characteristics. An additional line testing device is described in U.S. Pat. No. 4,169,220 issued to Gary Fields on Sept. 25, 1979 and entitled "Telephone Instrument Connection block with Remotely Actuated Line Test". Because of the very large number of MTUs required to update telephone systems around the country, it is highly desirable to provide a simple, economical trigger switch to replace the complicated circuitry now used as a bidirectional, low voltage switch for the TRIAC in the MTU.

SUMMARY OF THE INVENTION

The present invention comprises a telephone maintenance termination unit (MTU) having a low voltage, bidirectional trigger switch as a component. An MTU is a diagnostic circuit which is permanently installed at the subscriber's terminal of a telephone line. An MTU is utilized by the telephone company to analyze faults and perform maintenance on the line. The MTU currently provided by the Western Electric Company utilizes a complicated trigger circuit containing a multiplicity of elements to provide the specific low voltage switching performance necessary for the proper MTU response characteristics.

The MTU of the present invention contains a trigger switch which replaces the complex trigger circuitry of existing devices with a much simpler and more economical device. A major element of the previously existing MTU devices is a TRIAC, which must be switched to the on-state by a trigger circuit or device which functions at a very low current level and within a narrow, specific low voltage range.

The MTU of the present invention utilizes a bidirectional trigger switch of several different embodiments, all of which are simpler, less costly, and easier to fabricate and install than the currently used trigger circuits. One embodiment of the invention comprises two sensitive silicon controlled rectifiers (SCRs) connected in inverse parallel relationship, such that the anode of one is connected to the cathode of the other and the gates are connected directly to each other. The result is a bidirectional trigger switch which provides a trigger to switch the TRIAC to its on-state at a specific and well defined low voltage level.

In a second embodiment of the invention, the electronic trigger switch of the MTU is a silicon trigger switch (STS). The STS is a diffused semiconductor device having an anode at one end, a cathode at the other end, and an electrical behavior similar to two sensitive SCRs connected in inverse parallel relationship. In a third embodiment of the invention, the bidirectional electronic trigger switch is replaced by a DIAC having specialized, low voltage breakover characteristics. In a fourth embodiment, the electronic trigger switch comprises a silicon bilateral switch (SBS) similar to the General Electric type 2N4991, but having specialized, low voltage breakover characteristics.

Further embodiments of the invention provide an MTU without a TRIAC. One such embodiment replaces the TRIAC and trigger circuitry of the MTU with two non-sensitive SCRs connected in inverse parallel with their gate terminals joined using an STS such as described above. Another embodiment of the invention combines the TRIAC of the MTU and its associated trigger circuitry into one integrated circuit chip called a SIDAC.

BRIEF DESCRIPTION OF THE DRAWINGS

For a more complete understanding of the present invention and the advantages thereof, reference is now made to the following Description of the Preferred Embodiments taken in conjunction with the accompanying Drawings, in which.

DESCRIPTION OF THE PREFERRED EMBODIMENTS

Figure 1:
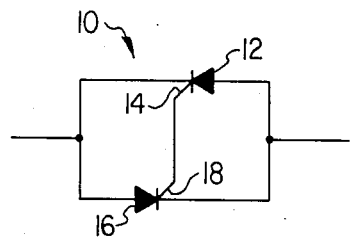
FIG. 1 is a schematic diagram of two silicon controlled rectifiers connected in inverse parallel relationship to form the electronic trigger switch used with the present invention.

Referring to FIG. 1, an embodiment of the electronic trigger switch 10 of the present invention is illustrated schematically in a circuit diagram. Trigger switch 10 comprises sensitive silicon controlled rectifier (SCR) 12 and sensitive SCR 16. Sensitive SCRs, such as the EC103 series of SCRs manufactured by Teccor Electronics, Inc., have very high gate impedence but require very low gate current, on the order of 12 to 500 microamperes, to trigger the SCRs to the conductive on-state. Trigger switch 10 is constructed by connecting the anode of SCR 12 to the cathode of SCR 16 and the anode of SCR 16 to the cathode of SCR 12. To complete the connection, the gate electrode 14 of SCR 12 is connected directly to the gate electrode 18 of SCR 16. The resulting circuit produces trigger switch 10, which is a two-terminal, bidirectional device.

Figure 2:
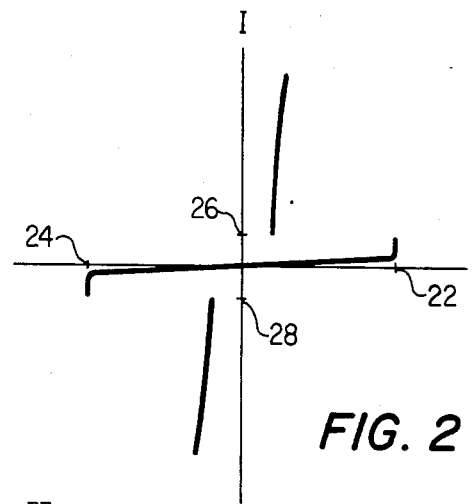
FIG. 2 is a voltage-current characteristic curve of the trigger switch of FIG. 1.

The voltage-current response curve of trigger switch 10 is illustrated in FIG. 2. The connection of identical SCRs in the inverse parallel configuration of FIG. 1 produces the symmetrical, bilateral response curve shown in FIG. 2. When voltage is applied to the terminals of trigger switch 10, current is initially blocked because the forward-biased SCR is in the off-state and the other SCR is reverse-biased. As the voltage increases, the voltage reaches the peak inverse voltage (PIV) of the reverse-biased SCR and current begins to flow out from the gate of the reverse-biased SCR. The current flowing out of the gate of the reverse-biased SCR enters the gate of the forward-biased SCR and switches the forward-biased SCR to the on-state, allowing principal current to flow through the forward-biased SCR and thus through trigger switch 10. The voltage-current curve of FIG. 2 shows the bidirectional behavior of trigger switch 10 by illustrating the symmetrical response as trigger switch 10 is biased in opposite directions. It can be seen that the Peak Inverse Voltage (PIV) of the reverse-biased SCR gate to cathode, corresponds to the breakover voltage 22, 24 of the trigger switch 10, which is about 16 to 19 volts. Once the forward-biased SCR is switched to the on-state, the trigger switch 10 will remain in the conductive state as long as the principal current exceeds the minimum holding current 26, 28 of the forward-biased SCR.

Figure 3:
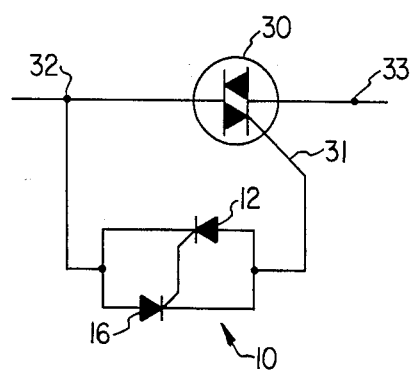
FIG. 3 is a schematic diagram of the trigger switch of FIG. 1 used as a trigger for a TRIAC.

An important application for trigger switch 10 is illustrated by the schematic diagram of FIG. 3. Trigger switch 10 is shown connected to the gate 31 of TRIAC 30 to act as a trigger for TRIAC 30. A TRIAC, such as logic TRIAC L201E7 manufactured by Teccor Electronics, Inc., is a power control device which requires a gate trigger current of about 3 to 25 milliamperes of either polarity to switch the TRIAC to the on-state. The use of trigger switch 10 in conjunction with TRIAC 30, as shown in FIG. 3, produces a circuit, having terminals 32 and 33, that has the characteristics of a low switching current, a high holding current, and a specific low voltage breakover point of either polarity.

Figure 4:
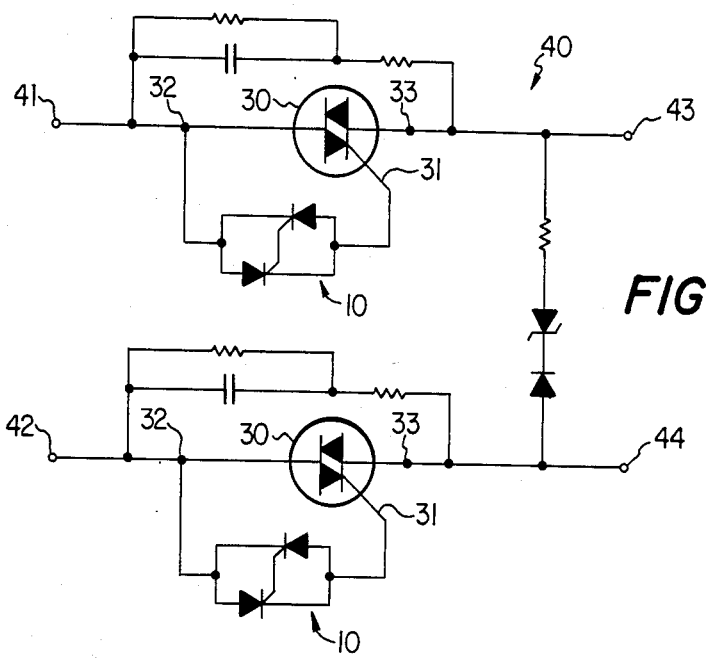
FIG. 4 is a schematic diagram of a telephone maintenance termination (MTU) utilizing the trigger switch of FIG. 1 and the TRIAC circuit of FIG. 3.
Figure 4:
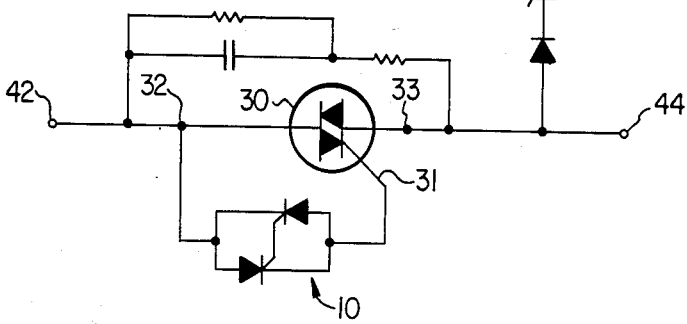

A specific embodiment of the present invention is the telephone maintenance termination unit (MTU) 40 illustrated schematically in FIG. 4. MTU 40 has terminals 41 and 42, which connect to the telephone line coming from the telephone company's central office, and terminals 43 and 44, which connect to the subscriber's telephone set. The line connected to terminal 41 is referred to as the "tip", and the line connected to terminal 42 is referred to as the "ring". The telephone company uses the MTU as a diagnostic circuit to test for faults or malfunctions in the telephone line servicing the subscriber. The telephone company applies electrical test signals to terminals 41 and 42 and receives a response depending upon the voltage of the test signal, the state of the MTU, and the presence of faults in the line or in the subscriber's telephone.

The MTU provided by the Western Electric Company utilizes a TRIAC similar to TRIAC 30 and a trigger circuit comprising at least two transistors, two resistors, and a rectifier bridge. The complicated circuitry provided by Western Electric is designed to trigger the TRIAC in the MTU with a low current and a low voltage in the narrow range of about 16 to 19 volts.

The present invention provides MTU 40 with TRIAC 30 and electronic trigger switch 10 as shown in FIG. 3 and described above. The circuit of FIG. 3, which utilizes trigger switch 10 having two SCRs connected in inverse parallel relationship, is connected to both the "tip" line and the "ring" line of MTU 40 at nodes 32 and 33. The simplified circuitry of the present invention, connected between nodes 32 and 33 as shown in FIG. 4, replaces the complicated circuitry provided by the Western Electric Company. The MTU of the present invention is designed to provide the same test signal response as the Western Electric MTU. However, the MTU of the present invention uses fewer circuit elements and a simpler circuit, thus providing cost savings associated with fewer components and easier circuit fabrication. The potential savings is large due to the very large number of MTUs which are to be installed on telephone lines around the world.

Figure 5:
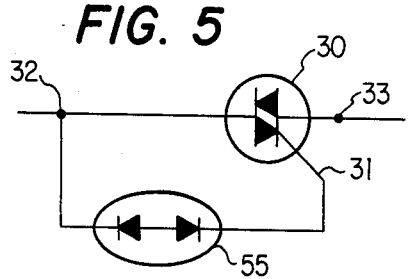
FIG. 5 is a schematic diagram of a silicon trigger switch that may be used in the MTU of FIG. 4.

Further embodiments of the present invention are shown in FIGS. 5–8, which illustrate alternative circuits that may be connected between nodes 32 and 33 of MTU 40. FIG. 5 shows a silicon trigger switch (STS) 55 that replaces the electronic trigger switch 10 in the circuit of FIG. 3. STS 55 is a two-terminal, bidirectional, diffused PNPN semiconductor device which functions with a voltage-current response similar to that of trigger switch 10. STS 55 is a simplification of MTU 40, wherein the two inverse parallel SCRs of trigger switch 10 are combined and fabricated in a single semiconductor chip having two terminals.

Figure 6:
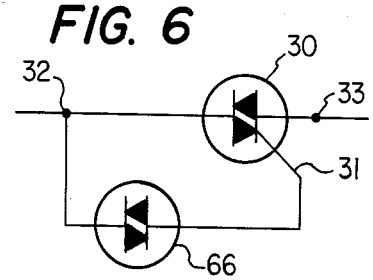
FIG. 6 is a schematic diagram of a DIAC that may be used as a trigger switch in the MTU of FIG. 4.

FIG. 6 illustrates another embodiment of MTU 40, wherein trigger switch 10 is replaced by a DIAC 66. DIAC 66 is designed specifically to have an abrupt, bilateral, low voltage breakover point so as to trigger TRIAC 30 in the same manner as trigger switch 10 or STS 55. This design further simplifies the circuit shown in FIG. 5 by replacing STS 55 with DIAC 66, which is a less complex semiconductor device.

Figure 7:
FIG. 7 is a schematic diagram of an integrated circuit chip (SIDAC) that replaces the TRIAC and trigger switch in the MTU of FIG. 4.

An embodiment of the present invention which simplifies the circuit of MTU 40 even further is shown in FIG. 7. The TRIAC 30 and the trigger switch 10, connected between nodes 32 and 33 of MTU 40, are replaced by a single, two-terminal semiconductor device referred to as a SIDAC 77. SIDAC 77 has the same low voltage, low current triggering characteristics, and high holding current characteristics, as the circuits described in conjunction with FIGS. 3, 5, and 6 above. SIDAC 77 is a more complicated semiconductor device than TRIAC 30, STS 55, or DIAC 66, but it is designed to provide fabrication and installation cost savings by combining several circuit elements into a single two-terminal device that functions effectively in a telephone system MTU.

Figure 8:
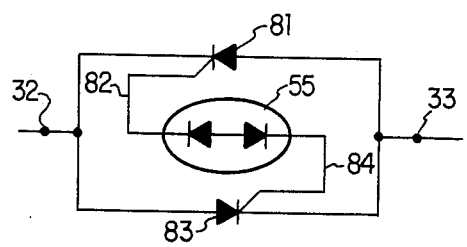
FIG. 8 is a schematic diagram of an alternative circuit that replaces the TRIAC and trigger switch of the MTU of FIG. 4.

FIG. 8 illustrates an alternative embodiment of the present invention wherein the circuit between nodes 32 and 33 of MTU 40 comprises non-sensitive SCRs 81 and 83 connected in inverse parallel relationship. SCRs 81 and 83 take the place of TRIAC 30 in MTU 40. Gates 82 and 84 of SCRs 81 and 83 are connected to opposite terminals of an STS 55, as shown in FIG. 8. Non-sensitive SCRs 81 and 83 provide the same power handling and high holding current characteristics of TRIAC 30 which they replace, and STS 55 provides low voltage, low current triggering for SCRs 81 and 83.

In a final embodiment of the invention (not shown), the trigger switch 10 of MTU 40 is replaced by a silicon bilateral switch (SBS) similar to the SBS type 2N4991 manufactured by the General Electric Company. However, the use of SBS 2N4991 provides only a slight simplification over the Western Electric MTU circuit. The SBS type 2N4991 is essentially two integrated circuits joined on a single semiconductor chip. Furthermore, present SBS circuits would require modification to produce the response characteristics that would enable them to function as trigger switches within an MTU.

From the foregoing description it can be seen that the present invention provides advantages related to its simplicity of structure and cost savings associated with the reduction of elements and assembly steps. Whereas the present invention has been described with respect to specific embodiments thereof, it is understood that various changes and modifications will be suggested to those skilled in the art, and it is intended that this disclosure encompass such changes and modifications as fall within the scope of the appended claims.

We claim:

1. A maintenance termination unit for connecting a telephone line to a telephone subscriber's telephone set, comprising:
   a TRIAC having first and second main terminals and a gate terminal, said first main terminal connected to the telephone set, said second main terminal connected to the telephone line;
   said TRIAC having an off-state and an on-state;
   said TRIAC requiring a holding current between said main terminals for holding said TRIAC in said on-state;
   a bidirectional electronic trigger switch connected between said gate terminal and said second main terminal of said TRIAC, said bidirectional electronic trigger switch comprising two silicon controlled rectifiers connected in inverse parallel relationship with the gates of said rectifiers permanently connected to each other;
   said trigger switch having a conductive state and a nonconductive state; and
   said trigger switch responsive to a predetermined voltage level to switch to said conductive state, thereby providing current to said gate to said TRIAC to trigger said TRIAC to said on-state.

2. The maintenance termination unit of claim 1, wherein said predetermined voltage level required to switch said trigger switch to said conductive state is about 16 volts to about 19 volts.

3. The maintenance termination unit of claim 1, wherein said holding current for holding said TRIAC in said on-state is about 1 milliamperes to about 25 milliamperes.

4. A maintenance termination unit for connecting a telephone line to a telephone subscriber's telephone set, comprising:
   a bidirection electronic switch having a conductive state a nonconductive state, said bidirection electronic switch being two nonsensitive silicon controlled rectifiers connected in inverse parallel relationship, wherein the gates of said rectifiers are connected to opposite ends of a two-terminal, bidirectional, diffused PNPN semiconductor device;
   said switch turning from said nonconductive state to said conductive state at a voltage level of about 16 volts to about 19 volts; and
   said switch remaining in said conductive state as long as the current flow through said switch exceeds a holding current of about 1 milliamperes to about 25 milliamperes.

5. The maintenance termination unit of claim 4, wherein said bidirectional switch comprises a unitary, two-terminal, diffused semiconductor device.

6. A maintenance termination unit for connecting a telephone line to a telephone subscriber's telephone set, comprising:
   a TRIAC having first and second main terminals and a gate terminal, said first main terminal connected to the telephone set, said second main terminal connected to the telephone line;
   said TRIAC having an off-state and an on-state;
   said TRIAC requiring a holding current between said main terminals for holding said TRIAC in said on-state;
   a bidirectional electronic trigger switch connected between said gate terminal and said second main terminal of said TRIAC, said bidirectional electronic trigger switch being a two-terminal, bidirectional, diffused PNPN semiconductor device;

said trigger switch having a conductive state and a nonconductive state; and said trigger switch responsive to a predetermined voltage level to switch to said conductive state, thereby providing current to said gate of said TRIAC to trigger said TRIAC to said onstate.

7. A maintenance termination unit for connecting a telephone line to a telephone subscriber's telephone set, comprising:

a TRIAC having first and second main terminals and a gate terminal, said first main terminal connected to the telephone set, said second main terminal connected to the telephone line;

said TRIAC having an off-state and an on-state;

said TRIAC requiring a holding current between said main terminals for holding said TRIAC in said on-state;

a bidirectional electronic trigger switch connected between said gate terminal and said second main terminal of said TRIAC, said bidirectional electronic trigger switch being an open base NPN semiconductor device;

said trigger switch having a conductive state and a nonconductive state; and said trigger switch responsive to a predetermined voltage level to switch to said conductive state, thereby providing current to said gate of said TRIAC to trigger said TRIAC to said on-state.

* * * * *

UNITED STATES PATENT AND TRADEMARK OFFICE
CERTIFICATE OF CORRECTION

PATENT NO. : 4,685,120
DATED : August 4, 1987
INVENTOR(S) : Richard G. Norris et al.

It is certified that error appears in the above-identified patent and that said Letters Patent is hereby corrected as shown below:

Column 6, line 26, change the second "to" to -- of --.

Signed and Sealed this

Thirty-first Day of May, 1988

Attest:

DONALD J. QUIGG

*Attesting Officer*   *Commissioner of Patents and Trademarks*